United States Patent
Zhao

(10) Patent No.: US 11,594,704 B2
(45) Date of Patent: Feb. 28, 2023

(54) OLED DISPLAY PANEL AND ENCAPSULATING METHOD OF SAME

(71) Applicant: Wuhan China Star Optoelectronics Semiconductor Display Technology Co., Ltd., Wuhan (CN)

(72) Inventor: Lei Zhao, Wuhan (CN)

(73) Assignee: Wuhan China Star Optoelectronics Semiconductor Display Technology Co., LTD., Wuhan (CN)

( * ) Notice: Subject to any disclaimer, the term of this patent is extended or adjusted under 35 U.S.C. 154(b) by 323 days.

(21) Appl. No.: 16/640,603

(22) PCT Filed: Nov. 8, 2019

(86) PCT No.: PCT/CN2019/116773
§ 371 (c)(1),
(2) Date: Feb. 20, 2020

(87) PCT Pub. No.: WO2021/003918
PCT Pub. Date: Jan. 14, 2021

(65) Prior Publication Data
US 2021/0408459 A1    Dec. 30, 2021

(30) Foreign Application Priority Data
Jul. 5, 2019 (CN) .......................... 201910604418.6

(51) Int. Cl.
*H01L 51/52* (2006.01)
*H01L 51/56* (2006.01)

(52) U.S. Cl.
CPC .......... *H01L 51/5253* (2013.01); *H01L 51/56* (2013.01); *H01L 2251/558* (2013.01)

(58) Field of Classification Search
None
See application file for complete search history.

(56) References Cited

U.S. PATENT DOCUMENTS

2005/0062052 A1    3/2005 Yang et al.
2018/0226608 A1*  8/2018 Nakagawa .......... H01L 51/0097
(Continued)

FOREIGN PATENT DOCUMENTS

CN    107104127 A    8/2017
CN    107170777 A    9/2017
(Continued)

*Primary Examiner* — Michelle Mandala
(74) *Attorney, Agent, or Firm* — PV IP PC; Wei Te Chung; Ude Lu

(57) ABSTRACT

An OLED display panel and an encapsulating method of the same are provided. The OLED display panel includes a base substrate; an OLED device disposed on the base substrate; and a thin film encapsulating layer. The thin film encapsulating layer includes a first inorganic layer, an organic layer, and a second inorganic layer. The organic layer comprises a lower surface contacted to the first inorganic layer, an upper surface away from the first inorganic layer, and a plurality of side surfaces connected to the upper surface and the lower surface, an orthogonal projection of the upper surface projecting on the base substrate is disposed within an orthogonal projection of the lower surface projecting on the base substrate, and each of the plurality of side surfaces is inclined.

9 Claims, 4 Drawing Sheets

(56) References Cited

U.S. PATENT DOCUMENTS

| | | | |
|---|---|---|---|
| 2018/0315956 A1* | 11/2018 | Jin | H01L 51/5253 |
| 2019/0155435 A1 | 5/2019 | Park | |
| 2019/0157617 A1* | 5/2019 | Peng | H01L 51/0097 |
| 2019/0229299 A1 | 7/2019 | Peng et al. | |
| 2019/0273099 A1* | 9/2019 | Wang | H01L 27/1262 |

FOREIGN PATENT DOCUMENTS

| | | |
|---|---|---|
| CN | 107195800 A | 9/2017 |
| CN | 108305954 A | 7/2018 |
| CN | 109301084 A | 2/2019 |

\* cited by examiner

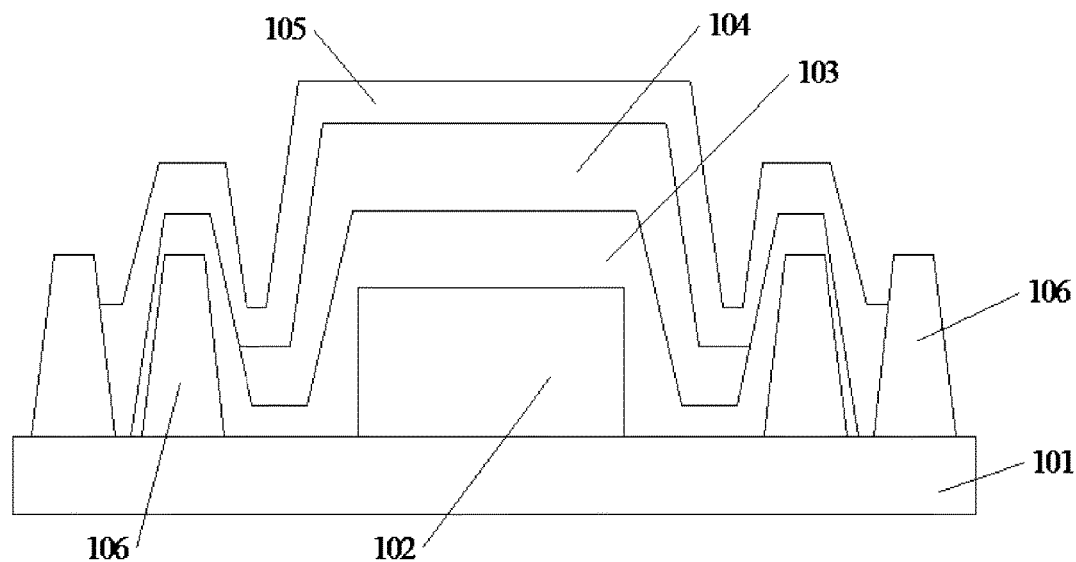
FIG. 1—Prior Art—
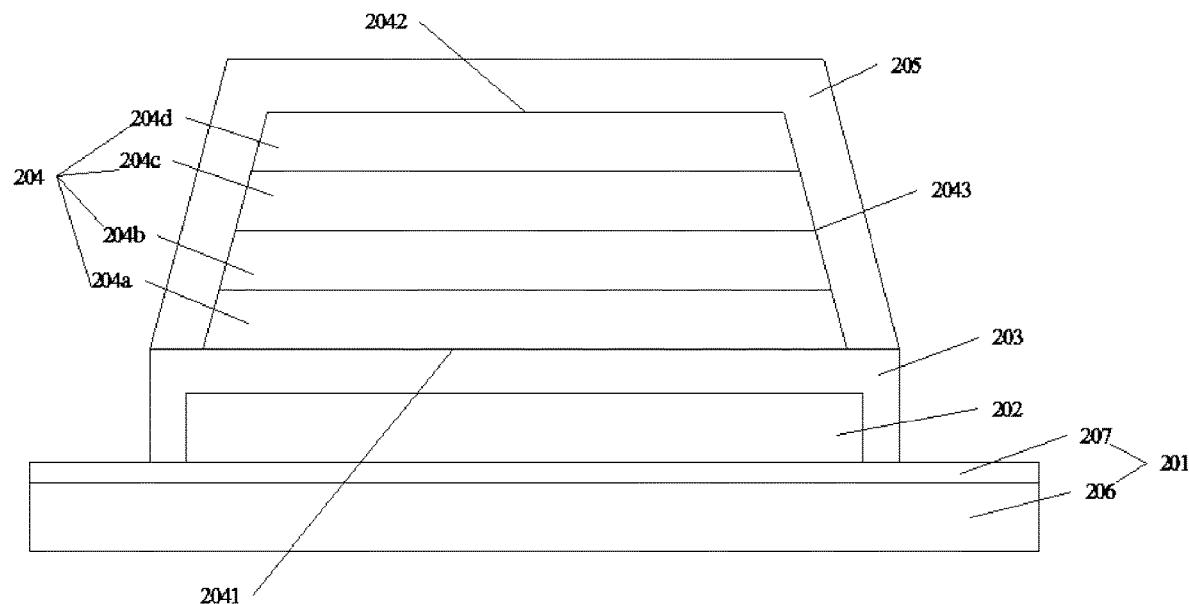
FIG. 2

OLED DISPLAY PANEL AND ENCAPSULATING METHOD OF SAME

CROSS-REFERENCE TO RELATED APPLICATIONS

This application is a U.S. National Phase of International PCT Application No. PCT/CN2019/116773 filed Nov. 8, 2019, which claims the benefit of Chinese Patent Application Serial No. 201910604418.6 filed Jul. 5, 2019, the contents of each application are incorporated herein by reference in their entirety.

FIELD

The present disclosure relates to display technologies, and more particularly, to an organic light emitting diode (OLED) display panel and an encapsulating method of the same.

BACKGROUND

Organic light emitting diode (OLED) displays have many advantages, such as self-emission, low driving voltage, high luminous efficiency, short response time, high definition and contrast, flexible display and large-area full-color display. It is recognized by industry as a most promising display device.

A packaging part of an OLED display panel usually adopts a laminated structure in which an inorganic layer, an organic layer, and an inorganic layer are sequentially distributed. Among them, the inorganic layer structure is mainly configured to prevent invasion of water and oxygen, and the organic layer structure is configured to improve stress between film layer structures and to cover particles from environment. In a process of leveling the organic solution, in order to match film formation areas of upper and lower inorganic films, organic solution must be leveled to form a film at a specified position. In the meantime, when the organic solution is leveled, the solution overflows and diffuses, which leads to problems that the accuracy of the OLED display panel is reduced and the resistance of the OLED display panel to water and oxygen is reduced.

At present, in order to prevent the organic solution from overflowing, an edge area of the OLED packaging part usually needs to be reserved with a large width. At the same time, two circles of retaining walls are set on an outer layer of the packaging part to prevent the organic layer from overflowing. OLED display panel edge width in the design is enlarge and is not favor products to narrow bezel. Therefore, there is need for an OLED display panel and an encapsulating method thereof to solve above problems.

SUMMARY

In view of the above, the present disclosure provides an organic light emitting diode (OLED) display panel and an encapsulating method of the same to reduce a width of a bezel of the OLED display panel to solve technical issues of not conducive to narrowing bezels of products due to increase of an edge width from an excessively wide edge region and too many retaining walls.

In order to achieve above-mentioned object of the present disclosure, one embodiment of the disclosure provides an OLED display panel, including:

a base substrate;

an OLED device disposed on the base substrate; and a thin film encapsulating layer including a first inorganic layer, an organic layer, and a second inorganic layer disposed on the OLED device and the base substrate in sequence;

wherein the organic layer includes a lower surface contacted to the first inorganic layer, an upper surface away from the first inorganic layer, and a plurality of side surfaces connected to the upper surface and the lower surface, an orthogonal projection of the upper surface projecting on the base substrate is disposed within an orthogonal projection of the lower surface projecting on the base substrate, and each of the plurality of side surfaces is inclined.

In one embodiment of the OLED display panel of the disclosure, a cross-section of the organic layer in a direction perpendicular to the base substrate is trapezoid.

In one embodiment of the OLED display panel of the disclosure, the organic layer includes a plurality of organic sub-layers disposed on the first inorganic layer in sequence;

side surfaces of the plurality of organic sub-layers at a same side are formed one of the side surfaces of the organic layer; and areas of cross sections of the plurality of organic sub-layers in a direction parallel to the base substrate are decreasing in a direction away from the base substrate.

In one embodiment of the OLED display panel of the disclosure, any two adjacent organic sub-layers includes a first organic sub-layer and a second organic sub-layer, an orthogonal projection of the first organic sub-layer projecting on the base substrate includes a plurality of first boundaries, and an orthogonal projection of the second organic sub-layer projecting on the base substrate includes a plurality of second sides corresponding to the first boundaries; and wherein each of the first boundaries is apart from a corresponding one of the second sides in a predetermined distance.

In one embodiment of the OLED display panel of the disclosure, the predetermined distance ranges from 2 μm to 3p.m.

In one embodiment of the OLED display panel of the disclosure, a thickness of the organic sub-layer is greater than a thickness of the first inorganic layer or a thickness of the second inorganic layer; and the thickness of the organic sub-layer ranges from 1.5 μm to 2 μm, the thickness of the first inorganic layer and the thickness of the second inorganic layer both range from 0.5 μm to 1.5p.m.

In one embodiment of the OLED display panel of the disclosure, thicknesses of the plurality of the organic sub-layers are the same; or thicknesses of the plurality of the organic sub-layers are different.

In one embodiment of the OLED display panel of the disclosure, the OLED display panel further includes a dam surrounding the thin film encapsulating layer and disposed on the base substrate.

Furthermore, another embodiment of the disclosure provides an encapsulating method of an organic light emitting diode (OLED) display panel, including steps of:

providing a base substrate and providing an OLED device on the base substrate;

providing a first inorganic layer covering the OLED device and disposed on the base substrate and the OLED device;

providing an organic layer on the first inorganic layer; and providing a second inorganic layer on the organic layer;

wherein the organic layer includes a lower surface contacted to the first inorganic layer, an upper surface away from the first inorganic layer, and a plurality of side surfaces connected to the upper surface and the lower surface, an orthogonal projection of the upper surface projecting on the base substrate is disposed within an orthogonal projection of the lower surface projecting on the base substrate, and each of the plurality of side surfaces is inclined.

In one embodiment of the encapsulating method of the OLED display panel of the disclosure, the organic layer includes a plurality of organic sub-layers disposed on the first inorganic layer in sequence;

side surfaces of the plurality of organic sub-layers at a same side are formed one of the side surfaces of the organic layer; and areas of cross sections of the plurality of organic sub-layers in a direction parallel to the base substrate are decreasing in a direction away from the base substrate.

In comparison with prior art, the OLED display panel provide the base substrate; the OLED device disposed on the base substrate; and the thin film encapsulating layer. The thin film encapsulating layer includes a first inorganic layer, an organic layer, and a second inorganic layer. The organic layer includes a lower surface contacted to the first inorganic layer, an upper surface away from the first inorganic layer, and a plurality of side surfaces connected to the upper surface and the lower surface. An orthogonal projection of the upper surface projecting on the base substrate is disposed within an orthogonal projection of the lower surface projecting on the base substrate. Each of the plurality of side surfaces is inclined. The OLED display panel of the present invention is provided by setting a boundary of the organic layer in the thin film encapsulating layer to an oblique downward shape. The shape is relatively stable. The organic layer includes a plurality of organic sub-layers, and the thickness of each organic sub-layers is thinner to avoid the thin film encapsulating layer from failure caused by overflow and diffusion of organic materials in the organic layer and prolong the service life of the OLED display panel. At the same time, the dam in the original OLED display panel can be reduced or removed directly to reduce the edge width of the OLED display panel and achieve narrow bezel of the product. The encapsulating method of the OLED display panel of the present invention makes the boundary of the organic layer into the oblique downward shape by means of distributed shrink-printing to avoid overflow and diffusion of organic materials in the organic layer, to prolong the service life of the OLED display panel, to reduced or removed directly a process of dam to reduce the edge width of the OLED display panel and achieve narrow bezel of the product.

BRIEF DESCRIPTION OF DRAWINGS

In order to more clearly illustrate the embodiments of the present application or the technical solutions in the prior art, the drawings used in the embodiments will be briefly described below. The drawings in the following description are only partial embodiments of the present application, and those skilled in the art can obtain other drawings according to the drawings without any creative work.

FIG. 1 is a schematic view of a structure of an organic light emitting diode (OLED) display panel according to prior art.

FIG. 2 is a schematic view of a structure of an OLED display panel according to a first embodiment of the present disclosure.

DETAILED DESCRIPTION

Figure 3:
FIG. 3 is a schematic view of a structure of an OLED display panel according to a second embodiment of the present disclosure.
Figure 4:
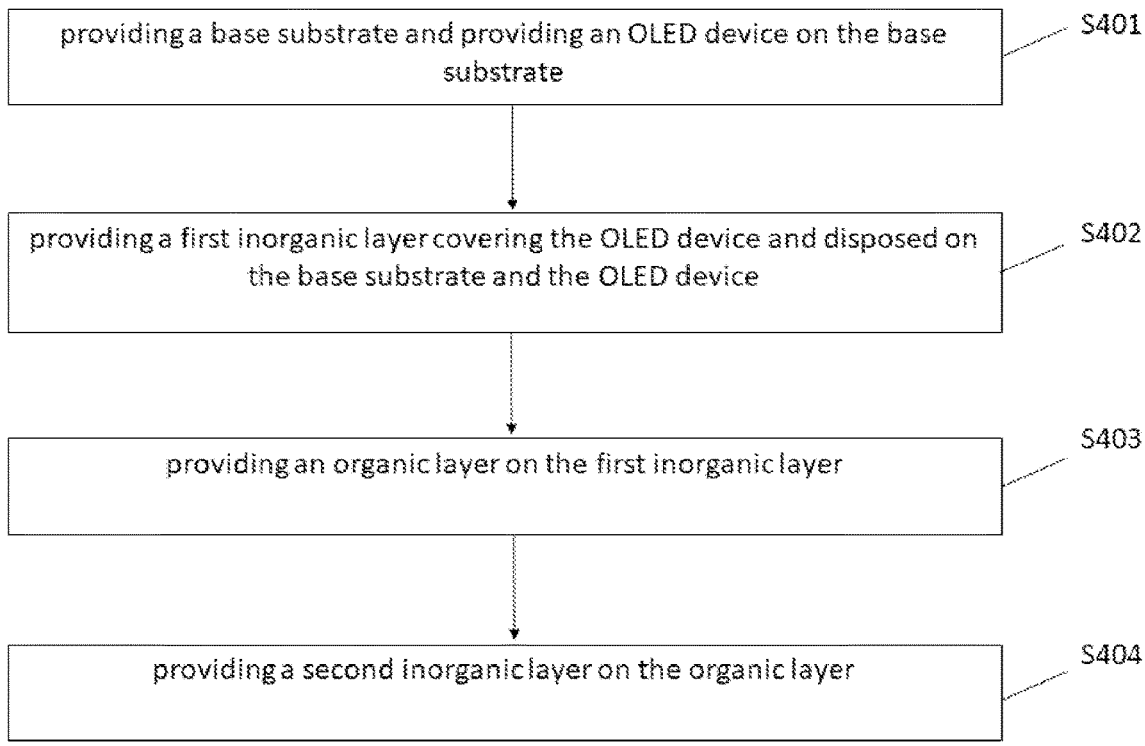
FIG. 4 is a schematic flowchart of an encapsulating method of an OLED display panel according to an embodiment of the present disclosure.
Figure 5A:
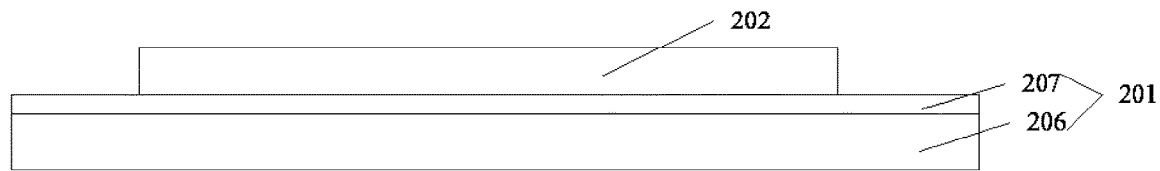
FIG. 5A is a schematic view of a structure in an encapsulating method of an OLED display panel after providing an OLED device according to an embodiment of the present disclosure.
Figure 5B:
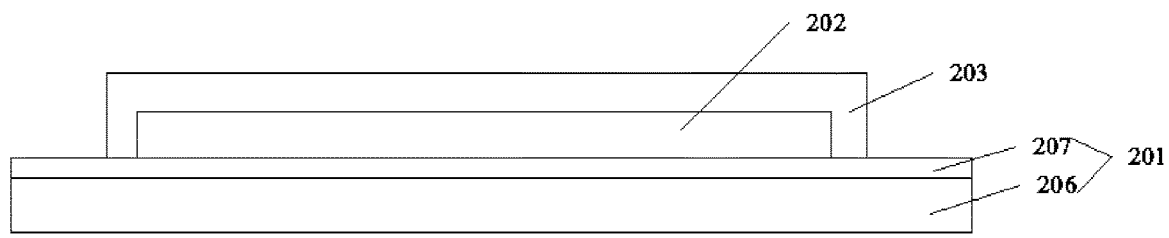
FIG. 5B is schematic view of a structure after providing a first inorganic layer base on FIG. 5A according to an embodiment of the present disclosure.
Figure 5C:
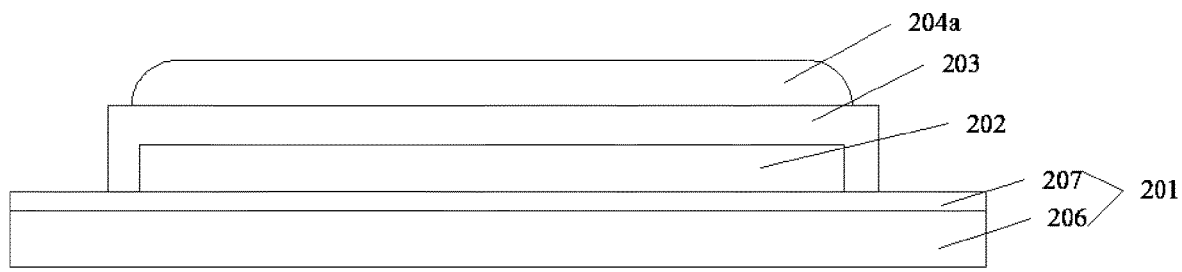
FIG. 5C is schematic view of a structure after providing a first organic sub-layer base on FIG. 5B according to an embodiment of the present disclosure.
Figure 5D:
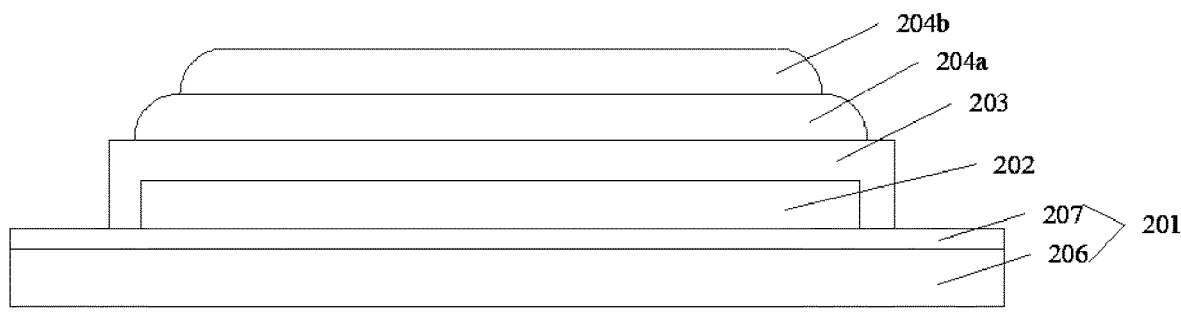
FIG. 5D is schematic view of a structure after providing a second organic sub-layer base on FIG. 5C according to an embodiment of the present disclosure.
Figure 5E:
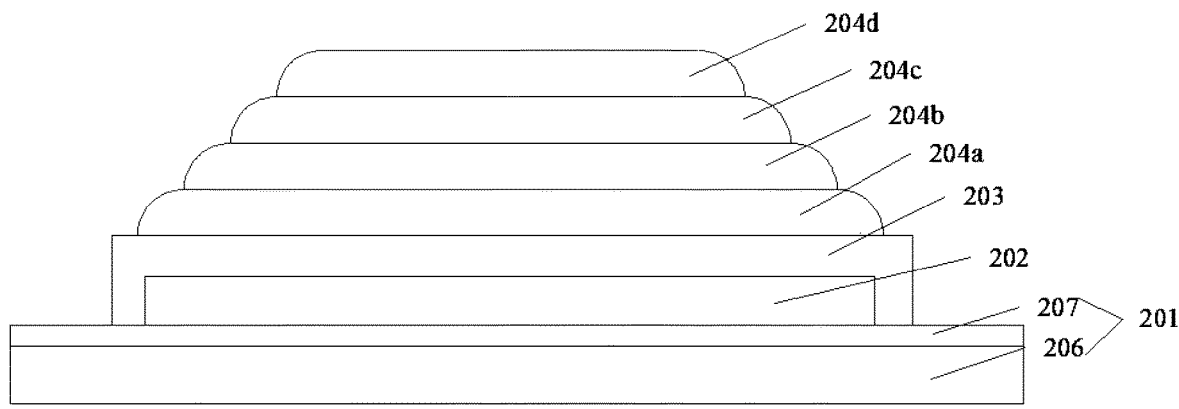
FIG. 5E is schematic view of a structure after providing a third and fourth organic sub-layers base on FIG. 5D according to an embodiment of the present disclosure.
Figure 5F:
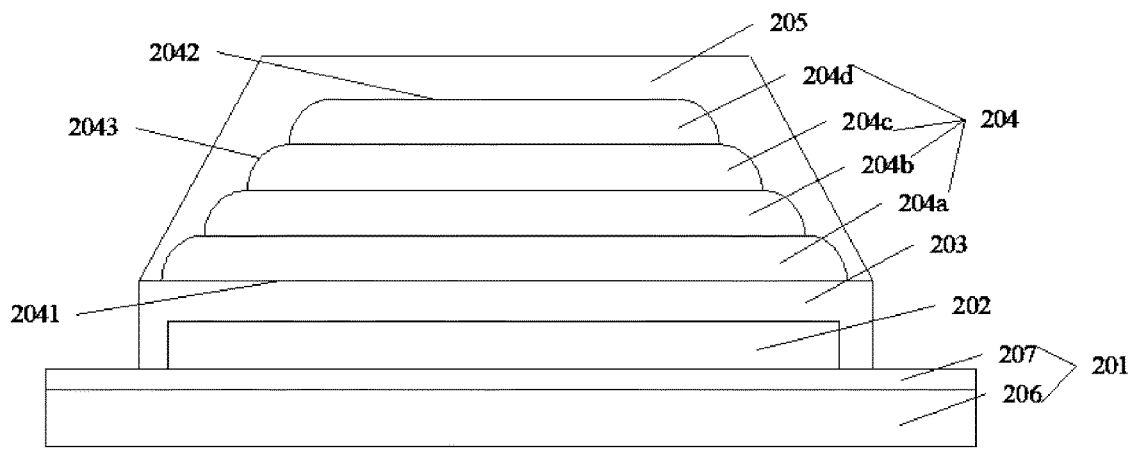
FIG. 5F is schematic view of a structure after providing a second inorganic layer base on FIG. 5E according to an embodiment of the present disclosure.

In the following, the technical solutions in the embodiments of the present application will be clearly and completely described with reference to the drawings in the embodiments of the present application. Obviously, the described embodiments are only a part of the embodiments of the present application, not all of the embodiments. Based on the embodiments in the present application, all other embodiments obtained by a person of ordinary skill in the art without creative efforts shall fall within the protection scope of the present application.

Referring to FIG. 1, a prior art OLED display panel includes a base substrate 101, an OLED device 102 disposed on the base substrate 101, and a thin film encapsulating layer encapsulating the OLED device 102. The thin film encapsulating layer includes a first inorganic layer 103, an organic layer 104, and a second inorganic layer 105. An inorganic layer is an effective barrier layer of water/oxygen, but during preparation of the inorganic layer, some defects such as pinholes or foreign matter will be generated. The organic layer can cover the defects of the inorganic layer to achieve flattening, and can release stress, block particles, and achieve flexible packaging.

In order to ensure that water and oxygen do not easily penetrate into the OLED device from an edge of the base substrate and cause abnormal picture display, an edge of the thin film encapsulating layer usually needs to reserve a large width, and two circles of dams 106 are set at the edge of the thin film encapsulating layer to prevent the organic material in the organic layer from overflowing, such a design is not conducive to a narrow bezel of the OLED display panel.

The present invention addresses the technical issues that an edge width of the existing OLED display panel is increased due to an excessively wide edge region and too many dams, which is not conducive to narrowing the bezel of the product. This embodiment can solve the defect.

One embodiment of the disclosure provides an OLED display panel, including: a base substrate; an OLED device disposed on the base substrate; and a thin film encapsulating layer including a first inorganic layer, an organic layer, and a second inorganic layer disposed on the OLED device and the base substrate in sequence; wherein the organic layer includes a lower surface contacted to the first inorganic layer, an upper surface away from the first inorganic layer, and a plurality of side surfaces connected to the upper surface and the lower surface, an orthogonal projection of the upper surface projecting on the base substrate is disposed within an orthogonal projection of the lower surface projecting on the base substrate, and each of the plurality of side surfaces is inclined. The OLED display panel of the present invention is provided the organic layer in the thin film encapsulating layer with a relatively stable shape to avoid the thin film encapsulating layer from failure caused by overflow and diffusion of organic materials in the organic layer. The OLED display panel of the present invention removed directly a process of dam or reduce a number of the dams to be one to reduce the edge width of the OLED display panel and achieve narrow bezel of the product.

The following describes an OLED display panel provided by the present invention more clearly in combination with various embodiments and drawings of the present invention.

Referring to FIG. 2, One embodiment of the disclosure provides an OLED display panel including: a base substrate 201; an OLED device 202 disposed on the base substrate 201; and a thin film encapsulating layer including a first inorganic layer 203, an organic layer 204, and a second inorganic layer 205 disposed in sequence on the OLED device 202 and the base substrate 201; wherein the organic layer 204 includes a lower surface 2041 contacted to the first inorganic layer 203, an upper surface 2042 away from the first inorganic layer 203, and a plurality of side surfaces 2043 connected to the upper surface 2042 and the lower surface 2041, an orthogonal projection of the upper surface 2042 projecting on the base substrate 201 is disposed within an orthogonal projection of the lower surface 2041 projecting on the base substrate 201, and each of the plurality of side surfaces 2043 is inclined.

In detail, the base substrate 201 includes a glass substrate 206 and a polyimide film 207 deposited on the glass substrate 206. The polyimide film 207 has good flexibility to facilitate the OLED display panel to bend to obtain a flexible display screen. The base substrate 201 may be an array substrate, that is, an array of thin film transistors is further arranged on the base substrate, and the OLED device is disposed on the thin film transistors.

In detail, the OLED device 202 includes an anode, a hole injection layer, a hole transport layer, a light emitting layer, an electron transport layer, an electron injection layer, and a cathode. The light emitting principle of the OLED device is that a semiconductor material and an organic light emitting material are driven in an electric field and emitting light when carriers injecting and recombination. In detail, OLED devices generally use indium tin oxide electrodes and metal electrodes as the anode and the cathode of the device. Under a certain voltage, electrons and holes are injected from the cathode and anode to the electron transport layer and the hole transport layer respectively. The electrons and holes migrate to the light-emitting layer through the electron transport layer and the hole transport layer respectively and meet in the light emitting layer to form excitons and excite light-emitting molecules. The latter undergoing radiation relaxation and emit visible light.

Further, the light emitting layer in the OLED device 202 is a light emitting material such as a polymer or an organic small molecule. The cathode is an active metal with a lower work function such as magnesium, and aluminum. A material used for the light-emitting layer is very sensitive to water vapor and oxygen as a material used for the cathode. Water/oxygen penetration will greatly reduce life of the OLED device 202. Therefore, an encapsulation layer needs to be provided in the OLED display panel to protect the OLED device 202.

The encapsulation layer used in this embodiment is a thin-film encapsulating layer. The thin-film encapsulation layer is a flexible encapsulating layer. The first inorganic layer 203 is disposed on the base substrate 201 and the OLED device 202 and covers the OLED device 202 to form a first-layer package. A material of the first inorganic layer 203 is an inorganic material such as silicon nitride, silicon oxide, or aluminum oxide. A function of the first inorganic layer 203 is to block external water and oxygen from penetrating the OLED device 202. The organic layer 204 is disposed on the first inorganic layer 203. A material of the organic layer 204 is an organic material such as acrylic, epoxy, or silicone resin. The organic layer 204 is provided for buffering stress between the inorganic layers and covering particles in the surrounding environment. The second inorganic layer 205 is disposed on the organic layer 204. The second inorganic layer 205 cover the organic layer 204. A material of the second inorganic layer 205 is an inorganic material such as silicon nitride, silicon oxide, or aluminum oxide for further preventing water and oxygen from entering the OLED device 202.

In one embodiment of the OLED display panel of the disclosure, a cross-section of the organic layer 204 in a direction perpendicular to the base substrate 201 is trapezoid.

In detail, in one embodiment of the OLED display panel of the disclosure, the organic layer 204 includes a plurality of organic sub-layers disposed in sequence on the first inorganic layer 203. Side surfaces of the plurality of organic sub-layers at a same side are formed one of the side surfaces 2043 of the organic layer 204. Areas of cross sections of the plurality of organic sub-layers in a direction parallel to the base substrate 201 are decreasing in a direction away from the base substrate. That is, the cross-section of the organic layer 204 in a direction perpendicular to the base substrate 201 is trapezoid. In other embodiments, the organic layer is a one-layer structure, cross-section of the organic layer in a direction perpendicular to the base substrate is trapezoid.

In one embodiment of the OLED display panel of the disclosure, any two adjacent organic sub-layers refer to a first organic sub-layer and a second organic sub-layer. An orthogonal projection of the first organic sub-layer projecting on the base substrate 201 includes a plurality of first boundaries. An orthogonal projection of the second organic sub-layer projecting on the base substrate 201 includes a plurality of second sides corresponding to the first boundaries. It should be noted that the first organic sub-layer is the organic sub-layer provided near the first inorganic layer 203. The second organic sub-layer is the organic sub-layer provided away from the first inorganic layer 203. An orthogonal projection of the second organic sub-layer projecting on the base substrate 201 is located within an orthogonal projection of the first organic sub-layer projecting on the base substrate 201. The first boundary and the second boundary are located on a same side of the organic layer 204. The first boundary and the second boundary should be parallel to each other. Each of the first boundaries is apart from a corresponding one of the second boundaries in a predetermined distance. In one embodiment of the OLED display panel of the disclosure, the predetermined distance ranges from 2 μm to 3 μm. The organic sub-layers have two or more layers. When the organic sub-layers have a multilayer structure such as two layers, three layers, and four layers, the predetermined distance may be 2 μm to 3 μm to ensure the organic layer 204 has its stable shape to prevent the organic material of the organic layer 204 from overflowing and diffusing. It can be understood that the predetermined distance of 2 μm to 3 μm is a better distance. The predetermined distance can be adjusted according to an actual thickness of the organic layer, and the predetermined distance can be greater than 3p.m.

In this embodiment, the organic sub-layers are four layers, which are a first organic sub-layer 204a, a second organic sub-layer 204b, a third organic sub-layer 204c, and a fourth organic sub-layer 204d. The first organic sub-layer 204a contacts the first inorganic layer 203. The second organic sub-layer 204b is disposed on the first organic sub-layer 204a. An orthogonal projection of the second organic sub-layer 204b projecting on the base substrate 201 is located within an orthogonal projection of the first organic sub-layer 204a projecting on the base substrate 201. The third organic sub-layer 204c is disposed on the second organic sub-layer 204b. An orthogonal projection of the third organic sub-layer 204c projecting on the base substrate 201 is within an orthogonal projection of the second organic sub-layer 204b projecting on the base substrate 201. The fourth organic sub-layer 204d is disposed on the third organic sub-layer 204c. An orthogonal projection of the fourth organic sub-layer 204d projecting on the base substrate 201 is located within an orthogonal projection of the third organic sub-layer 204c projecting on the base substrate 201. It should be noted that, in other embodiments, a number of the organic sub-layers may not be four, and the number of the organic sub-layers may be two or more.

The second inorganic layer 205 completely covers the organic layer 204, and the second inorganic layer 205 contacts the first inorganic layer 203. The first inorganic layer 203 and the second inorganic layer 205 form a closed structure to completely covered the organic layer 204 to isolate outside. The organic layer 204 is a laminated structure. There is predetermined distance between the sides corresponding to the adjacent organic sub-layers. When the OLED display panel is subjected to bending, the laminated structure of the organic layer 204 can alleviate stress generated during the bending to a greater extent. The inorganic layer covering the organic layer 204 can prevent material of the organic layer 204 from overflowing and causing package failure.

In detail, a thickness of each of the organic sub-layer ranges from 1.5 μm to 2 μm. A thickness of the first inorganic layer and a thickness of the second inorganic layer both range from 0.5 μm to 1.5 μm. The thicknesses of every organic sub-layers may be the same or different. The predetermined distance between the sides of adjacent two of the organic sub-layers may be the same or different. In other embodiments, there are five layers, six layers or more of the organic sub-layers. The thickness of the organic sub-layer can be adjusted according to the thickness that the organic layer 204 should have. The organic sub-layer may have multiple organic sub-layers with a thickness less than 1.5p.m.

In the first embodiment of the OLED display panel of the disclosure, the organic layer of the thin film encapsulating layer includes a plurality of organic sub-layers that the areas of cross sections of the plurality of organic sub-layers in a direction parallel to the base substrate are decreasing in sequence. The organic sub-layers adopt a laminated structure to form a stable structure of the organic layer. The first inorganic layer and the second inorganic layer form a closed structure to completely covered the organic layer to prevent material of the organic layer from overflowing and causing package failure, to alleviate stress generated during the bending of the OLED display panel, and to prolong the service life of the OLED display panel. The edge width of the OLED display panel is less than an edge width of a prior art OLED display panel to conducive to achieving narrow bezel of the product.

Please refer to FIG. 3, a difference between the OLED display panel provided in a second embodiment of the present invention and the first embodiment is that the OLED display panel further includes a dam 308 disposed around the thin film encapsulating layer and disposed on the base substrate 201. The first inorganic layer 203 covers the dam 308, and the organic layer 204 is located in a surrounding space of the dam 308.

When the first inorganic layer 203 covers the OLED device 202, pinholes and foreign matter defects appear on a surface of the first inorganic layer 203 due to the uneven surface. In order to cover these defects, the thickness of the first organic sub-layer 204a in contact with the first inorganic layer 203 should be slightly larger. At the same time, the area of the first organic sub-layer 204a will increase when it is leveled. In order to prevent the organic layer 204 from overflowing and diffusing, a circle of dam 308 is required to block the organic layer 204.

The dam 308 may be an organic material, such as a polystyrene and a photo-resistive material. When polystyrene is selected, due to the photosensitive properties of polystyrene, it has the characteristics of convenience and ease when forming the dam 308; The dam 308 may also be filled with a water-absorbing material inside. For example, the dam 308 is arranged around the thin film encapsulating layer, and the inside of the dam 308 is filled with the water-absorbing material. When water and oxygen enter the OLED device 202, the water absorbing material in the dam 308 reacts with water and oxygen to form a water and oxygen barrier such as a hydrogel. The water and oxygen barrier is a solidified block, which can further prevent water and oxygen from penetrating the OLED device 202 to prevents the OLED display panel from failing. A material of the dam of the present invention may also be other types of materials, such as a water blocking material, and the present invention does not limit this.

The dam 308 may have a rectangular, trapezoidal, or inverted trapezoidal cross-section in a direction perpendicular to the substrate 201. For example, the dam 308 has an inverted trapezoidal cross-section. When the organic layer 204 is leveled on the first inorganic layer 203, the organic material of the organic layer 204 will slowly contact the inverted trapezoidal edge of the dam 308. The edge of the dam 308 is inverted inclined to force the organic material back to where the organic layer 204 is set. The organic material itself is viscous, and can maintain a hemispherical shape after reflow, thereby effectively preventing the organic layer 204 from overflowing and diffusing. It can be understood that in the present invention, the structure of the dam is not limited to the above, and may also be other structures capable of blocking the overflow of the organic layer, which is not limited in the present invention.

The OLED display panel provided by the second embodiment of the present invention adds a circle of dam on the basis of the first embodiment, which can further prevent the packaging failure due to overflow and diffusion of the organic layer, and prolong the service life of the OLED display panel. Compared with the existing OLED display panel, the OLED display panel of the disclosure has a smaller number of dams, reduces the edge width of the OLED display panel, and is conducive to achieving a narrow bezel of the product.

Referring to FIG. 4, FIG. 5A to FIG. 5F, furthermore, another embodiment of the disclosure provides an encapsulating method of an OLED display panel, including steps of:

At step S401: providing a base substrate and providing an OLED device on the base substrate;

At step S402: providing a first inorganic layer covering the OLED device and disposed on the base substrate and the OLED device;

At step S403: providing an organic layer on the first inorganic layer; and

At step S404: providing a second inorganic layer on the organic layer.

The organic layer 204 includes a lower surface 2041 contacted to the first inorganic layer 203, an upper surface 2042 away from the first inorganic layer 203, and a plurality of side surfaces 2043 connected to the upper surface 2042 and the lower surface 2041, an orthogonal projection of the upper surface 2042 projecting on the base substrate 201 is disposed within an orthogonal projection of the lower surface 2041 projecting on the base substrate 201, and each of the plurality of side surfaces 2043 is inclined.

The base substrate 201 includes a glass substrate 206 and a polyimide film 207 deposited on the glass substrate 206. The polyimide film 207 has good flexibility to facilitate the OLED display panel to bend to obtain a flexible display screen. The base substrate 201 may be an array substrate, that is, an array of thin film transistors is further arranged on the base substrate, and the OLED device is disposed on the thin film transistors. The OLED device 202 includes an anode, a hole injection layer, a hole transport layer, a light emitting layer, an electron transport layer, an electron injection layer, and a cathode.

Referring to FIG. 5A to FIG. 5F, the first inorganic layer 203 can be prepared on the base substrate 201 and the OLED device 202 by a chemical vapor deposition process, and the thickness is ranging from 0.5 μm to 1.5 μm. The first inorganic layer 203 covers the OLED device 202, and an edge of the first inorganic layer 203 spreads onto the base substrate 201 as a first-layer package of the OLED device 202. The organic layer 204 is prepared on the first inorganic layer 203 by ink jet printing. The organic layer 204 may include a plurality of the organic sub-layers. At this time, the organic sub-layers may be prepared by distributed shrink printing. For example, the first organic sub-layer is provided on the first inorganic layer 203, and the thickness ranges from 1.5 μm to 2 μm. A second organic sub-layer is printed on the first organic sub-layer, and the thickness of the second organic sub-layer ranges from 1.5 μm to 2 μm. A print area of the second organic sub-layer can be retracted by 2 μm to 3 μm compared to a print area of the first organic sub-layer. then a print area of the organic sub-layer prepared on the second organic sub-layer can also be retracted 2 μm to 3 μm, and so on, until an actual demand of the thickness of the organic layer is obtained. After the organic sub-layers are formed, the sides of the organic layers 204 are inclined downward. Finally, a chemical vapor deposition process is used to prepare the second inorganic layer 205 on the organic layer 204. The thickness ranges from 0.5 μm to 1.5 μm. Then packaging is done.

The materials of the first inorganic layer 203 and the second inorganic layer 205 include inorganic materials such as silicon nitride, silicon oxide, and aluminum oxide. The inorganic materials can block water and oxygen from entering the OLED device 202. The material of the organic layer 204 is an organic material such as acrylic, epoxy resin, or silicone resin. The organic layer 204 is used for buffering the stress between the inorganic layers and covering particles surrounding there.

Referring to FIG. 5A to FIG. 5F again, in the embodiment, there are four organic sub-layers, which are the first organic sub-layer 204a, the second organic sub-layer 204b, the third organic sub-layer 204c, and the fourth organic sub-layer 204d. The first organic sub-layer 204a is in contact with the first inorganic layer 203. The second organic sub-layer 204b is disposed on the first organic sub-layer 204a. The orthogonal projection of the second organic sub-layer 204b projecting on the base substrate 201 is located within the orthogonal projection of the first organic sub-layer 204a projecting on the base substrate 201. The third organic sub-layer 204c is disposed on the second organic sub-layer 204b. The orthogonal projection of the third organic sub-layer 204c projecting on the base substrate 201 is located within the orthogonal projection of the second organic sub-layer 204b projecting on the base substrate 201. The fourth organic sub-layer 204d is disposed on the third organic sub-layer 204c. The orthogonal projection of the fourth organic sublayer 204d projecting on the base substrate 201 is located within the orthogonal projection of the third organic sub-layer 204c projecting on the base substrate 201. It should be noted that, in other embodiments, the number of the organic sub-layers may not be four, and the number of the organic sub-layers may be two or more.

Further, after the organic layer is formed, a circle of dam may be prepared in an edge region of the organic layer by an inkjet printing method or other methods. The dam is formed on the base substrate. The organic layer is located in an enclosure space of the dam. The dam may be an organic material, such as a polystyrene and a photoresist material. When polystyrene is selected, due to photosensitive properties of the polystyrene, it is convenient and easy to form the dam. The dam may also be filled with a water-absorbing material inside. For example, the dam is provided around the thin film encapsulating layer, and the inside of the dam is filled with the water-absorbing material. When water or oxygen is penetrating a side of the OLED device, the water-absorbing material in the dam will react with water and oxygen first to form a water and oxygen barrier such as a hydrogel. The water and oxygen barrier is a solidified block, which can further prevent water or oxygen from reaching the OLED device to prevent the OLED display panel from failing. The dam may have a rectangular, a trapezoidal, or an inverted trapezoidal cross-section in a direction perpendicular to the base substrate. For example, the cross-section of the dam is an inverted trapezoidal structure. When the organic layer is leveled on the first inorganic layer, the organic material of the organic layer will slowly contact the inverted trapezoidal edge of the dam. Because the edge of the dam is inverted inclined to force the organic material back to where the organic layer is set. The organic material itself is viscous, and can maintain a hemispherical shape after reflow, thereby effectively preventing the organic layer from overflowing and diffusing. It can be understood that in the present invention, the structure of the dam is not limited to the above, and may also be other structures capable of blocking the overflow of the organic layer, which is not limited in the present invention.

The encapsulating method of the OLED display panel provided by the embodiment of the present invention makes the sides of the organic layer have an inverted inclined shape structure by means of distributed shrink printing. The structure is stable and can prevent from package failure caused by overflow of organic materials in the organic layer, improve water and oxygen barrier ability of the OLED display panel, and prolongs a service life of the OLED display panel. An edge width of the OLED display panel is small, which is conducive to the narrow bezel of the products.

The beneficial effect of the present invention is that the OLED display panel of the present invention includes a base substrate, an OLED device provided on the base substrate, and a thin film encapsulating layer. The thin film encapsulating layer includes a first inorganic layer, an organic layer, and a second inorganic layer. The organic layer includes a lower surface in contact with the first inorganic layer, an upper surface away from the first inorganic layer, and a plurality of side surfaces connecting the upper surface and the lower surface. An orthogonal projection of the upper surface projecting on the base substrate is located within an orthogonal projection of the lower surface projecting on the base substrate. Each of the sides is inclined. The OLED display panel of the present invention provides a thin film encapsulating layer with inclined downward shape. The shape is more stable. The organic layer includes a plurality of organic sub-layers, and each organic sub-layer has a thin thickness to prevent from failure of the thin-film encapsulating layer caused by overflow and diffusion of organic materials in the organic layer, to prolong the service life of the OLED display panel, and at the same time to reduce or to directly remove the dam in the original OLED display panel to reduce the edge width of the OLED display panel and achieve narrow product bezel. The encapsulating method of the OLED display panel of the present invention makes the edges of the organic layer inclined downward by means of distributed shrink printing to avoid from overflow and diffusion of organic materials in the organic layer, and to prolong the service life of the OLED display panel, to reduce or to directly remove the process of dam, to reduce the edge width of the OLED display panel, and to realize the narrow bezel of the product.

The present disclosure has been described by the above embodiments, but the embodiments are merely examples for implementing the present disclosure. It must be noted that the embodiments do not limit the scope of the invention. In contrast, modifications and equivalent arrangements are intended to be included within the scope of the invention.

What is claimed is:

1. An organic light emitting diode (OLED) display panel, comprising:
   a base substrate;
   an OLED device disposed on the base substrate;
   a thin film encapsulating layer comprising a first inorganic layer, an organic layer, and a second inorganic layer disposed on the OLED device and the base substrate in sequence; and
   a dam having an inverted trapezoidal cross-section, surrounding the thin film encapsulating layer, and disposed on the base substrate, wherein the first inorganic layer covers the dam, and the organic layer is disposed within a space enclosed by the dam, the organic layer comprises a lower surface contacted to the first inorganic layer, an upper surface away from the first inorganic layer, and a plurality of side surfaces connected to the upper surface and the lower surface, an orthogonal projection of the upper surface projecting on the base substrate is disposed within an orthogonal projection of the lower surface projecting on the base substrate, each of the plurality of side surfaces is inclined, the organic layer comprises a plurality of organic sub-layers disposed on the first inorganic layer in sequence, and a thickness of an organic sub-layer directly in contact with the first inorganic layer is greater than a thickness of another organic sub-layers not directly connected to the first inorganic layer.

2. The OLED display panel according to claim 1, wherein a cross-section of the organic layer in a direction perpendicular to the base substrate is trapezoid.

3. The OLED display panel according to claim 1, wherein side surfaces of the plurality of organic sub-layers at a same side are formed one of the side surfaces of the organic layer; and
   areas of cross sections of the plurality of organic sub-layers in a direction parallel to the base substrate are decreasing in a direction away from the base substrate.

4. The OLED display panel according to claim 3, wherein any two adjacent organic sub-layers comprises a first organic sub-layer and a second organic sub-layer, an orthogonal projection of the first organic sub-layer projecting on the base substrate comprises a plurality of first boundaries, and an orthogonal projection of the second organic sub-layer projecting on the base substrate comprises a plurality of second sides corresponding to the first boundaries; and
   wherein each of the first boundaries is apart from a corresponding one of the second sides in a predetermined distance.

5. The OLED display panel according to claim 4, wherein the predetermined distance ranges from 2 μm to 3 μm.

6. The OLED display panel according to claim 3, wherein a thickness of the organic sub-layer is greater than a thickness of the first inorganic layer or a thickness of the second inorganic layer; and
   the thickness of the organic sub-layer ranges from 1.5 μm to 2 μm, the thickness of the first inorganic layer and the thickness of the second inorganic layer both range from 0.5 μm to 1.5 μm.

7. The OLED display panel according to claim 6, wherein thicknesses of the plurality of the organic sub-layers are the same; or
   thicknesses of the plurality of the organic sub-layers are different.

8. An encapsulating method of the organic light emitting diode (OLED) display panel of claim 1, comprising steps of:
   providing a base substrate and providing an OLED device on the base substrate;
   providing a first inorganic layer covering the OLED device and disposed on the base substrate and the OLED device;
   providing an organic layer on the first inorganic layer; and
   providing a second inorganic layer on the organic layer;
   wherein the organic layer comprises a lower surface contacted to the first inorganic layer, an upper surface away from the first inorganic layer, and a plurality of side surfaces connected to the upper surface and the lower surface, an orthogonal projection of the upper surface projecting on the base substrate is disposed within an orthogonal projection of the lower surface projecting on the base substrate, and each of the plurality of side surfaces is inclined.

9. The encapsulating method of the OLED display panel according to claim 8, wherein the organic layer comprises a plurality of organic sub-layers disposed on the first inorganic layer in sequence;
   side surfaces of the plurality of organic sub-layers at a same side are formed one of the side surfaces of the organic layer; and areas of cross sections of the plurality of organic sublayers in a direction parallel to the base substrate are decreasing in a direction away from the base substrate.

\* \* \* \* \*